(12) United States Patent
Forcier et al.

(10) Patent No.: US 10,128,389 B2
(45) Date of Patent: Nov. 13, 2018

(54) NITRIDE UV LIGHT SENSORS ON SILICON SUBSTRATES

(71) Applicant: ROSESTREET LABS, LLC, Phoenix, AZ (US)

(72) Inventors: Robert Forcier, Phoenix, AZ (US); Wladyslaw Walukiewicz, Phoenix, AZ (US)

(73) Assignee: ROSESTREET LABS, LLC, Phoenix, AZ (US)

( * ) Notice: Subject to any disclaimer, the term of this patent is extended or adjusted under 35 U.S.C. 154(b) by 0 days.

(21) Appl. No.: 15/718,612

(22) Filed: Sep. 28, 2017

(65) Prior Publication Data

US 2018/0019351 A1 Jan. 18, 2018

Related U.S. Application Data

(62) Division of application No. 13/659,206, filed on Oct. 24, 2012, now Pat. No. 9,780,239.

(Continued)

(51) Int. Cl.
*H01L 21/00* (2006.01)
*H01L 31/0304* (2006.01)
(Continued)

(52) U.S. Cl.
CPC .. *H01L 31/03044* (2013.01); *H01L 31/03048* (2013.01); *H01L 31/1035* (2013.01);
(Continued)

(58) Field of Classification Search
None
See application file for complete search history.

(56) References Cited

U.S. PATENT DOCUMENTS 5,625,202 A * 4/1997 Chai ............... H01L 33/007
257/103
7,834,367 B2 * 11/2010 Parikh ............. H01L 29/475
257/449

(Continued)

FOREIGN PATENT DOCUMENTS

JP 2007165478 A 6/2007

OTHER PUBLICATIONS

Final Rejection of U.S. Appl. No. 13/659,206 dated Feb. 17, 2017.*
(Continued)

*Primary Examiner* — Telly Green
(74) *Attorney, Agent, or Firm* — Greenberg Traurig LLP

(57) ABSTRACT

An ultraviolet light sensor and method of manufacturing thereof are disclosed. The ultraviolet light sensor includes Group-III Nitride layers adjacent to a silicon wafer with one of the layers at least partially exposed such that a surface thereof can receive UV light to be detected. The Group-III Nitride layers include a p-type layer and an n-type layer, with p/n junctions therebetween forming at least one diode. Conductive contacts are arranged to conduct electrical current through the sensor as a function of ultraviolet light received at the outer Group-III Nitride layer. The Group-III Nitride layers may be formed from, e.g., GaN, InGaN, AlGaN, or InAlN. The sensor may include a buffer layer between one of the Group-III Nitride layers and the silicon wafer. By utilizing silicon as the substrate on which the UV sensor diode is formed, a UV sensor can be produced that is small, efficient, cost-effective, and compatible with other semiconductor circuits and processes. The sensor may be configured to be sensitive to a specific subtype or subband of ultraviolet radiation to be detected by selecting a specific composition of said Group-III Nitride layers.

17 Claims, 5 Drawing Sheets

Related U.S. Application Data

(60) Provisional application No. 61/550,868, filed on Oct. 24, 2011.

(51) Int. Cl.
   *H01L 31/103* (2006.01)
   *H01L 31/18* (2006.01)

(52) U.S. Cl.
   CPC ...... *H01L 31/1848* (2013.01); *H01L 31/1856* (2013.01); *Y02E 10/544* (2013.01); *Y02P 70/521* (2015.11)

(56) References Cited

U.S. PATENT DOCUMENTS

| | | | |
|---|---|---|---|
| 7,964,482 B2* | 6/2011 | Lieten | ............... C30B 23/02 257/189 |
| 8,575,592 B2 | 11/2013 | Bergmann et al. | |
| 9,780,239 B2 | 10/2017 | Forcier et al. | |
| 2004/0029365 A1 | 2/2004 | Linthicum et al. | |
| 2004/0051099 A1 | 3/2004 | Moustakas | |
| 2004/0200975 A1 | 10/2004 | Brown et al. | |
| 2008/0173882 A1* | 7/2008 | Parikh | ............... H01L 29/475 257/94 |
| 2009/0184254 A1 | 7/2009 | Miura | |
| 2009/0189192 A1* | 7/2009 | Lieten | ............... C30B 23/02 257/200 |
| 2009/0294777 A1 | 12/2009 | Cheng et al. | |
| 2011/0031579 A1* | 2/2011 | Parikh | ............... H01L 29/475 257/473 |
| 2011/0187294 A1* | 8/2011 | Bergmann | ............. H01L 33/04 315/363 |
| 2013/0026484 A1* | 1/2013 | Walukiewicz | ........ H01L 29/778 257/76 |
| 2013/0099249 A1 | 4/2013 | Forcier et al. | |
| 2013/0126894 A1* | 5/2013 | Parikh | ............... H01L 29/475 257/76 |

OTHER PUBLICATIONS

Korean Intellectual Property Office; PCT International Search Report and Written Opinion, issued in connection to PCT/US2012/061581; dated Mar. 4, 2013; 9 pages; Korea.

* cited by examiner

NITRIDE UV LIGHT SENSORS ON SILICON SUBSTRATES

RELATED APPLICATIONS

This application is a divisional application of U.S. Non-Provisional application Ser. No. 13/659,206, filed Oct. 24, 2012, entitled "NITRIDE UV LIGHT SENSORS ON SILICON SUBSTRATES," by Forcier et al., which itself claims priority to and claims the benefit of U.S. Patent Application No. 61/550,868, filed Oct. 24, 2011, the entire disclosures of which applications are incorporated herein by reference.

TECHNICAL FIELD

The present disclosure generally relates to semiconductor devices, and more particularly to a structure and method for forming Nitride ultraviolet (UV) sensors, including sensors for sensing one or more of UVA, UVB and UVC radiation.

BACKGROUND

An ultraviolet sensor or detector absorbs UV radiation generally in the wavelength range between 100 nm to 400 nm and provides an output indicative of the sensed UV radiation. The UV spectrum can be subdivided into a number of different subbands, such as UVA, UVB and UVC. The wavelength (photon energy) of these subbands of the UV radiation range from 400 nm to 315 nm for UVA (3.1 eV to 3.94 eV), 315 nm to 280 nm for UVB (3.94 eV to 4.43 eV), and 280 nm to 100 nm for UVC (4.43 eV to 12.4 eV).

Typically, UV sensors are very costly because they utilize exotic and expensive wafer substrate materials, such as silicon carbide and sapphire wafers, which can be an order of magnitude more expensive than the silicon of which most semiconductors are typically manufactured.

SUMMARY

An ultraviolet light sensor and method of manufacturing thereof are disclosed. The ultraviolet light sensor includes Group-III Nitride layers adjacent to a silicon wafer with one of the layers at least partially exposed such that a surface thereof can receive UV light to be detected. The Group-III Nitride layers include a p-type layer and an n-type layer, with p/n junctions therebetween forming at least one diode. First and second conductive contacts are arranged to conduct electrical current through the sensor as a function of ultraviolet light received at the outer Group-III Nitride layer. The Group-III Nitride layers may be formed from, e.g., GaN, InGaN, AlGaN, or InAlN. The sensor may include a buffer layer between one of the Group-III Nitride layers and the silicon wafer. By utilizing silicon as the substrate on which the ultraviolet sensor diode is formed, a UV sensor can be produced that is small, efficient, cost-effective, and compatible with other semiconductor circuits and processes. The sensor may be configured to be sensitive to a specific subtype or subband of ultraviolet radiation to be detected by selecting a specific composition of the Group-III Nitride layers.

DRAWINGS

The above-mentioned features of the present disclosure will become more apparent with reference to the following description taken in conjunction with the accompanying drawings wherein like reference numerals denote like elements and in which.

DETAILED DESCRIPTION

Figure 1:
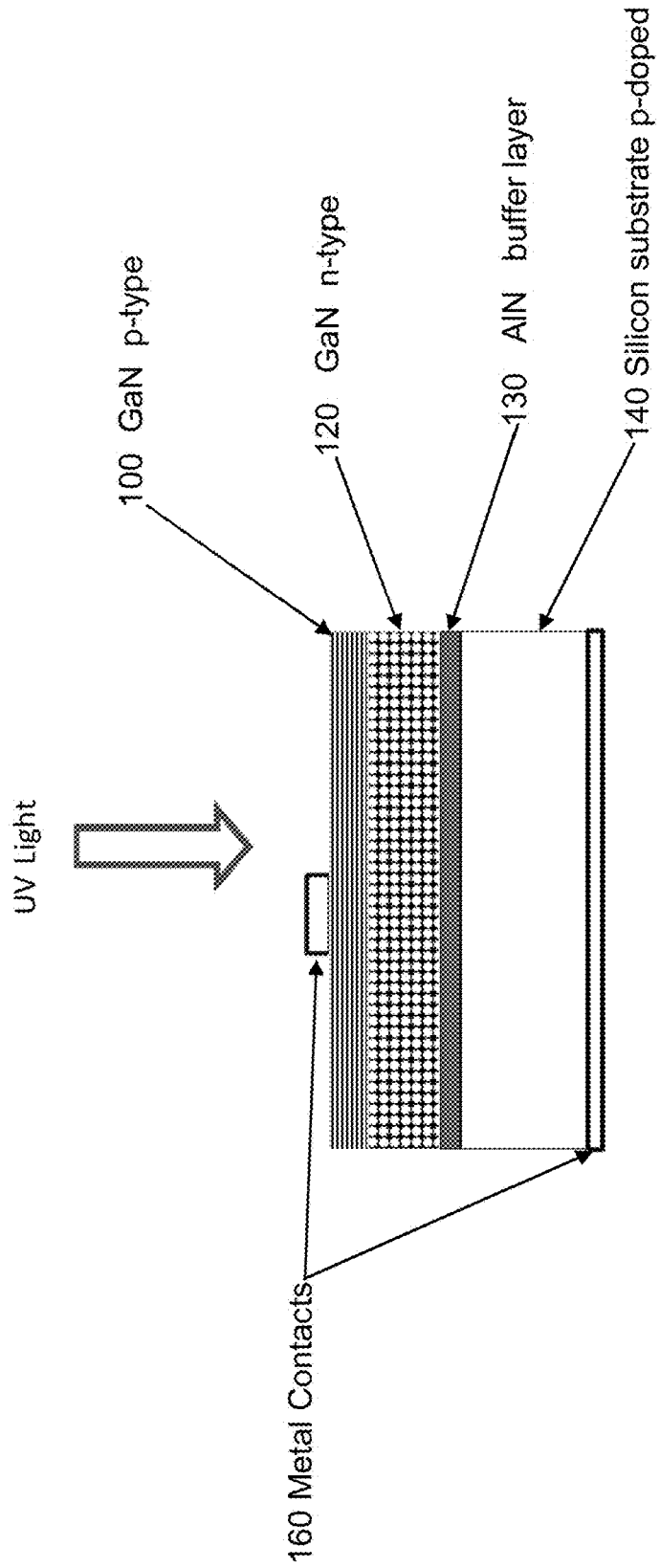
FIG. 1 is a cross-sectional view illustrating the layers of an operational Nitride UV GaN sensor diode formed on a silicon substrate in accordance with one or more embodiments of the present disclosure that is sensitive to UVA, UVB and UVC subbands.

Reference will now be made in detail to the preferred embodiments of the present invention, examples of which are illustrated in the accompanying drawings in which like reference number indicate like components. The following description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "an embodiment" or "the embodiment" means that a particular feature, structure, or characteristic described in connection with the embodiment is included in at least an embodiment of the disclosure. The appearances of the phrase "in an embodiment" or "in one or more embodiments" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In general, the present disclosure is directed to various embodiments of structures and methods for the formation of UV, UVA, UVB and UVC sensors from Group-III Nitride semiconductor P/N junctions forming diodes with engineered band edge selectivity of various UV frequencies.

In one or more embodiments, a structure and method are provided for the formation of UV, UVA, UVB and UVC sensors from Group-III Nitride semiconductor P/N junctions forming diodes with engineered band edge selectivity of various UV frequencies. Group-III Nitride semiconductors, including InN, GaN and AlN and their alloys, have a direct energy gap ranging from 0.7 eV (InN) to 6.2 eV (AlN). The band gap can be selectively adjusted to be sensitive to the specific subtype or subband of the UV radiation being detected. In one or more embodiments, the Group-III Nitride semiconductor material comprises GaN, AlGaN, InGaN, or InAlN.

In one or more embodiments, a structure and method are provided for the formation of UV, UVA, UVB and UVC sensors from Group-III Nitride semiconductor P/N junctions on a silicon substrate in order to provide a highly reliable UV sensor with dramatically lower costs of formation and other advantages. By utilizing silicon as the substrate on which the UV sensor diode is formed, a UV sensor that is small, efficient and cost-effective can be produced. This device structure allows lower cost and smaller packages for electronic assemblies that are further compatible with silicon substrates and other low cost substrates frequently utilized in the semiconductor industry. The UV sensor of the invention can, in some embodiments, be integrated on the same silicon wafer as other semiconductor circuits.

In one or more embodiments, a UV sensor comprising a GaN, InGaN, AlGaN or InAlN P/N junction formed on a silicon substrate in accordance with the invention can be used in many applications and markets, such as smartphones that include functionality for detecting UV radiation levels that are harmful to the skin.

Referring now to FIG. 1, a block diagram is shown that illustrates the layers of an operational Nitride UV sensor diode in accordance with one or more embodiments of the present disclosure that is sensitive to UVA, UVB and UVC subbands. The UV sensor of FIG. 1 includes a p-type GaN top layer 100, followed by an n-type GaN layer 120 which is formed on a buffer layer 130, all of which are formed on a silicon substrate wafer 140. The buffer layer 130 assists with growing the GaN layers 100, 120 on the silicon substrate wafer 140 so as to improve the quality and in turn the performance of the GaN layers 100, 120. Metal contacts 160 for the sensor diode are formed on at least a portion of the opposing outside surfaces of the Nitride UV sensor.

In one or more embodiments, the substrate wafer 140 comprises a silicon substrate in order to provide a highly reliable UV sensor with dramatically lower costs of formation than conventional UV sensors that made use of silicon carbide or sapphire wafers. By utilizing silicon as the substrate wafer 140 on which the UV sensor diode is formed, a UV sensor in accordance with the present disclosure that is small, efficient and cost-effective can be produced. While silicon is preferably used as the substrate wafer 140 for these advantages and its customary usage in the semiconductor industry, it is understood that other low-cost substrates frequently utilized in the semiconductor industry could be used in place of silicon in the various embodiments described herein, such as glass or the like.

Figure 2:
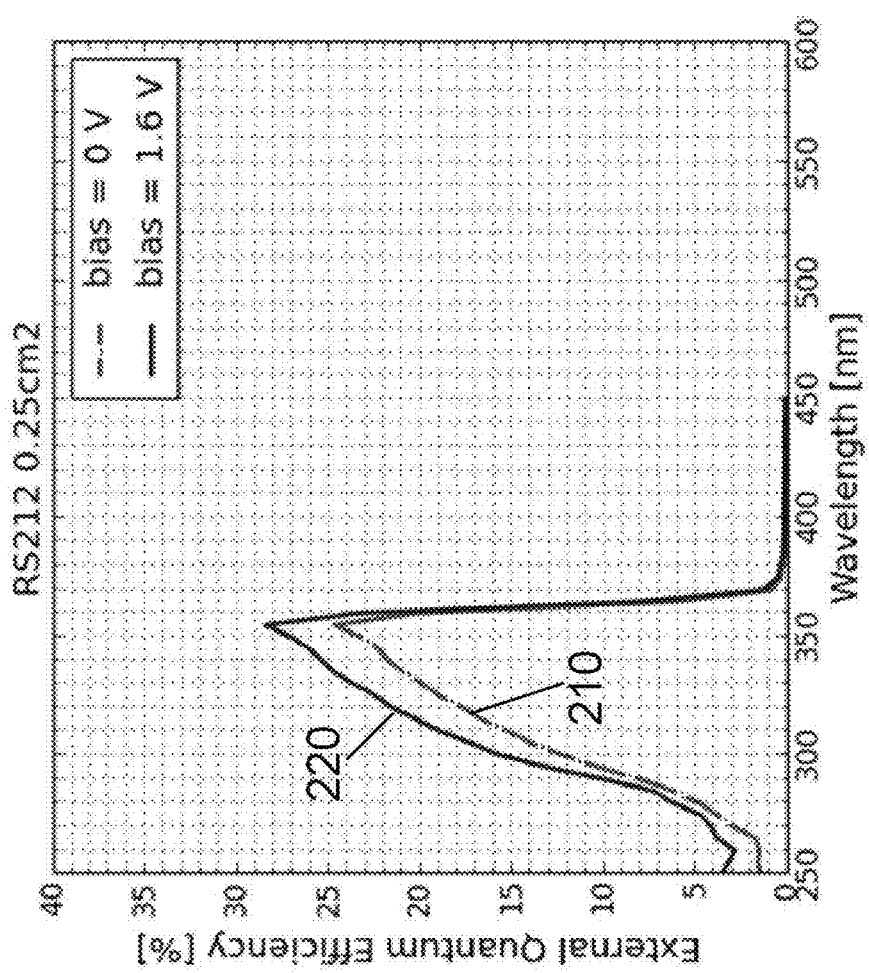
FIG. 2 shows a graphical representation of a spectral response curve for the Nitride UV sensor of FIG. 1 illustrating the External Quantum Efficiency {EQE} and the corresponding wavelength of such sensor.

FIG. 2 shows a graphical representation illustrating a spectral response curve for the Nitride UV GaN sensor of FIG. 1. In particular, FIG. 2 illustrates dependencies of the External Quantum Efficiency {EQE} on the corresponding wavelength of such sensor. FIG. 2 shows a UVA response below 370 nm. Curve 210 represents a bias of 0 V, while curve 220 represents a bias of 1.6 V.

Figure 3:
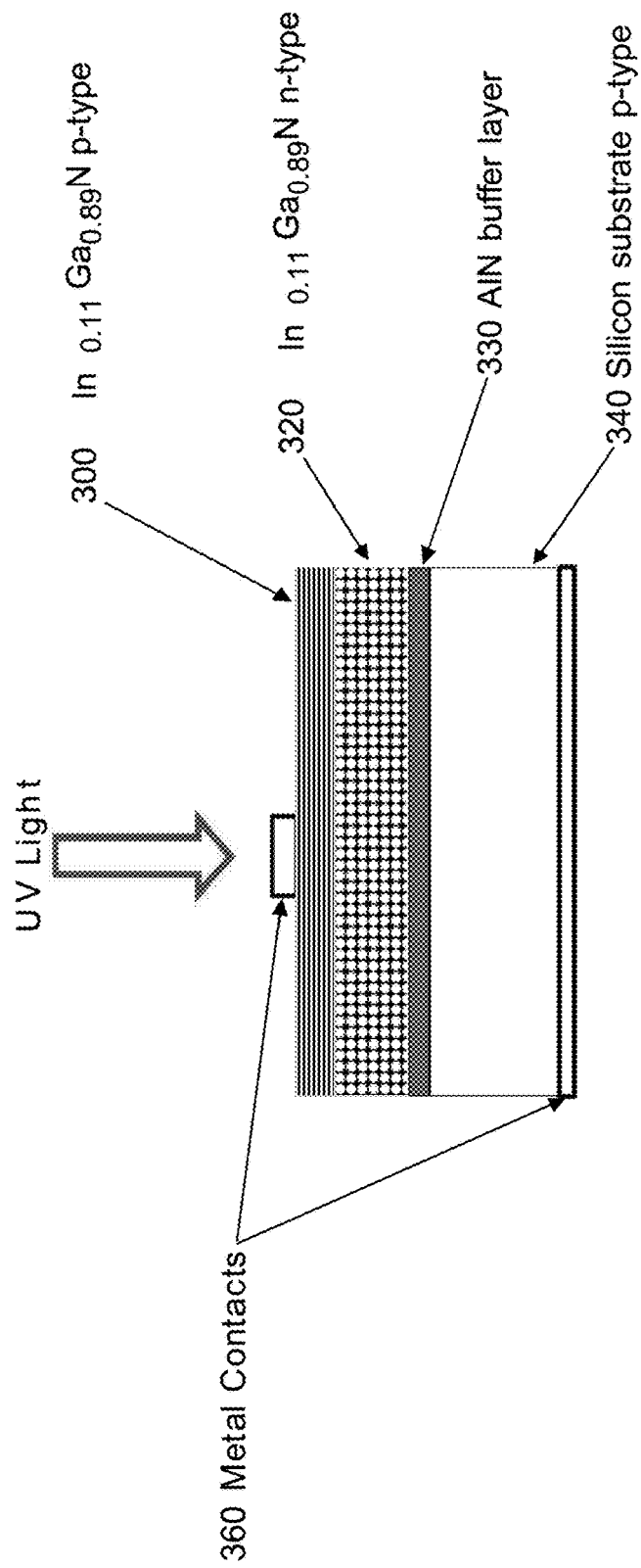
FIG. 3 is a cross-sectional view illustrating the layers of an operational Nitride UV InGaN sensor diode formed on a silicon substrate in accordance with one or more embodiments of the present disclosure that is sensitive to UVA, UVB and UVC subbands.

Referring now to FIG. 3, a block diagram is provided that illustrates the layers of an operational Nitride UV InGaN sensor diode formed on a silicon substrate in accordance with one or more embodiments of the present disclosure. In such embodiments, the UV sensor is designed to be sensitive to UVA, UVB and UVC subbands. The structure of FIG. 3 includes a p-type $In_{0.11}Ga_{0.89}N$ (or $In_{0.38}Al_{0.62}N$) top layer 300, followed by an n-type $In_{0.11}Ga_{0.89}N$ (or $In_{0.38}Al_{0.62}N$) layer 320 which is formed on a buffer layer of AlN 330, all of which are formed on a silicon substrate wafer 140. Metal contacts 360 for the sensor diode are formed on at least a portion of the opposing outside surfaces of the Nitride UV sensor. In one or more embodiments, the specific alloy composition of $In_{0.11}Ga_{0.89}N$ allows the various UV frequencies for each of the UVA, UVB and UVC subbands to be detected. The specific composition of the Group-III Nitride semiconductor layers forming the P/N junction can be engineered to possess band edge selectivity for the desired UV frequencies to be detected.

Figure 4:
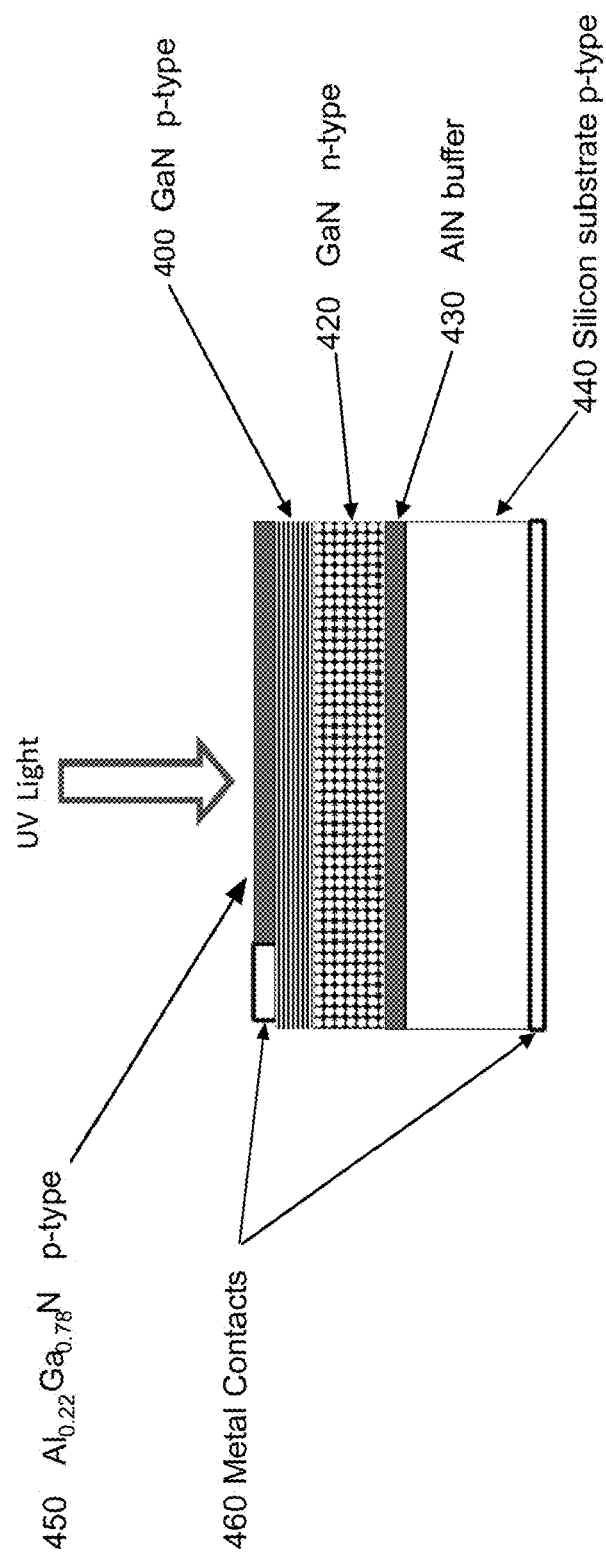
FIG. 4 is a cross-sectional view illustrating the layers of an operational Nitride UVA only GaN sensor diode including a filter in accordance with one or more embodiments of the present disclosure.

Referring now to FIG. 4, a block diagram is provided that illustrates the layers of a working Nitride UVA only GaN sensor diode in accordance with one or more embodiments of the present disclosure. The UVA sensor of FIG. 4 includes a filter ($Al_{0.22}Ga_{0.78}N$ (or $In_{0.27}Al_{0.73}N$) layer 450) that only allows the UVA subband to pass there through, where the specific composition of the $Al_{0.22}Ga_{0.78}N$ (or $In_{0.27}Al_{0.73}N$) layer 450 is engineered for this purpose. The filter layer 450 is formed on a p-type GaN top layer of the diode 400, followed by an n-type GaN bottom layer of the diode 420. The diode layers are formed on a buffer layer of AlN 430, which is formed on a silicon substrate wafer 440. Metal contacts 460 for the sensor diode are formed on at least a portion of the opposing outside surfaces of the Nitride UVA sensor.

Figure 5:
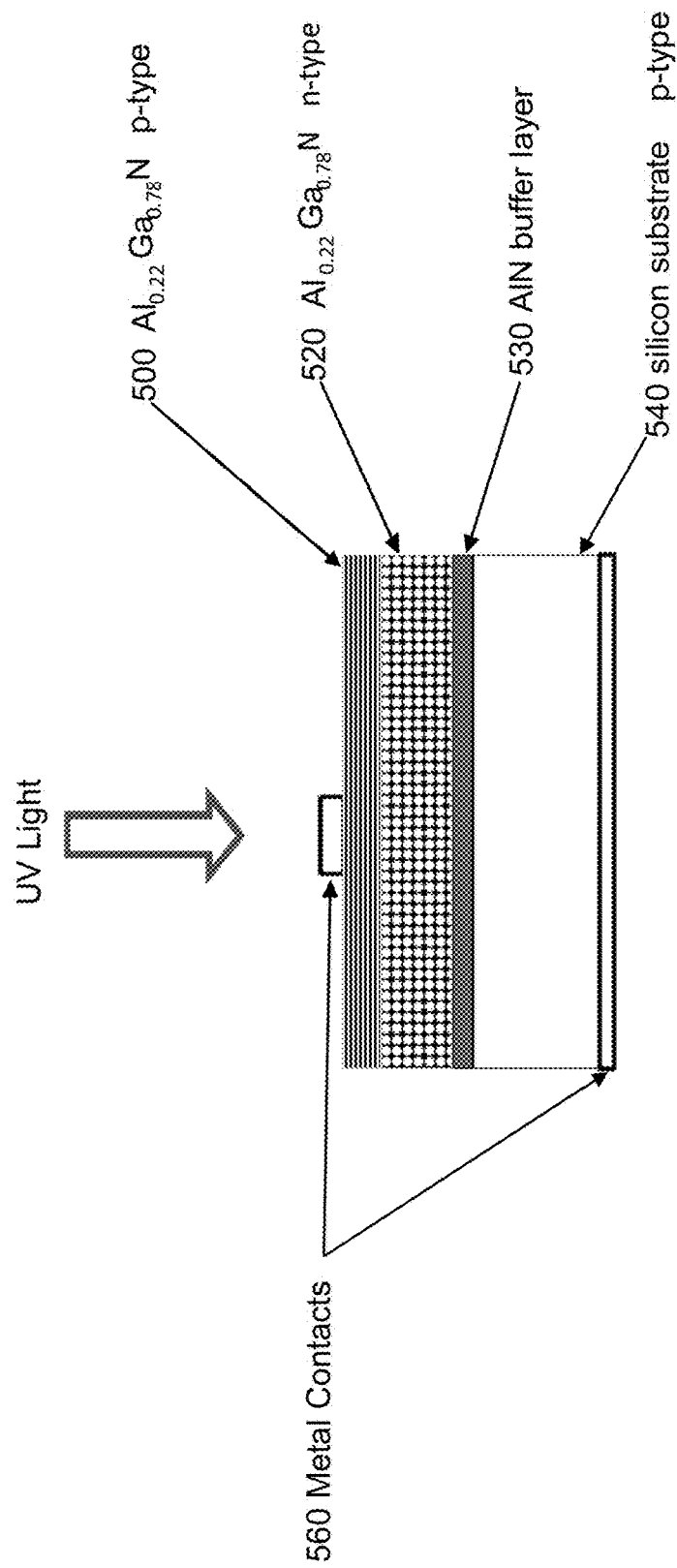
FIG. 5 is a cross-sectional view illustrating the layers of an operational Nitride UVB AlGaN sensor diode formed on a silicon substrate in accordance with one or more embodiments of the present disclosure.

Referring now to FIG. 5, a block diagram is provided that illustrates the layers of a working Nitride UVB AlGaN sensor diode in accordance with one or more embodiments of the present disclosure The UVB sensor of FIG. 5 includes a p-type $Al_{0.22}Ga_{0.78}N$ (or $In_{0.27}Al_{0.73}N$) layer top layer of the diode 500, followed by an n-type $Al_{0.22}Ga_{0.78}N$ (or $In_{0.27}Al_{0.73}N$) layer bottom layer of the diode 520. The diode layers are formed on a buffer layer of AlN 530, which is formed on a silicon substrate wafer 540. Metal contacts 560 for the sensor diode are formed on at least a portion of the opposing outside surfaces of the Nitride UVA sensor.

In the various embodiments described herein, the metal contacts 160, 360, 460, 560 are formed from any conductive materials used in accordance with methods known to those skilled in the art of manufacturing UV sensors. In one or more embodiments, the top metal contact on the UV sensor should be sized and formed so as to allow UV radiation to travel past the top metal contact to enter into the UV sensor, such as by forming the top metal contact on only a portion of the top surface of top diode layer, from Indium-Tin-Oxide or other suitable semi-transparent or substantially transparent conductive material (e.g., NiAl) or by forming the contact in a grid formation.

In the various embodiments described herein, the buffer layers 130, 330, 430, 530 are described as comprising AlN but it is understood that the buffer layers may alternatively comprise other materials known to those skilled in the art to assist in the formation of the semiconductor layers on a silicon substrate wafer. However, in one or more alternative embodiments, it is understood that the Nitride UV sensors described herein may be formed without the use of a buffer layer.

In one or more embodiments, the Group-III Nitride layers (or other layers) may be deposited using any number of known deposition techniques, such as molecular beam epitaxy (MBE), metal-organic chemical vapor deposition (MOCVD), hydride vapor phase epitaxy (HVPE), remote plasma chemical vapor deposition (RPCVD), or any other appropriate deposition method.

The above embodiments and preferences are illustrative of the present invention. It is neither necessary, nor intended for this patent to outline or define every possible combination or embodiment. The inventor has disclosed sufficient information to permit one skilled in the art to practice at least one embodiment of the invention. The above description and drawings are merely illustrative of the present invention and that changes in components, structure and procedure are possible without departing from the scope of the present invention as defined in the following claims. For example, elements and/or steps described above and/or in the following claims in a particular order may be practiced in a different order without departing from the invention. Thus, while the invention has been particularly shown and described with reference to embodiments thereof, it will be understood by those skilled in the art that various changes in form and details may be made therein without departing from the spirit and scope of the invention.

The invention claimed is:

1. A method for manufacturing an ultraviolet light sensor, comprising:
    forming Group-III Nitride layers adjacent to a silicon wafer such that one of said Group-III Nitride layers is at least partially exposed, whereby said one of said Group-III Nitride layers can receive ultraviolet light to be detected, said Group-III Nitride layers comprising a p-type layer and an n-type layer with p/n junctions therebetween forming at least one diode;
    forming a filter in direct contact with a top surface of said one of said Group-III Nitride layers, wherein the filter is a nitride layer that only allows a subband of ultraviolet light to pass through; and
    forming first and second conductive contacts such that said contacts conduct electrical current as a function of ultraviolet light received in at least one of said Group-III Nitride layers.

2. The method for manufacturing an ultraviolet light sensor according to claim 1, wherein said step of forming Group-III Nitride layers comprises selectively adjusting a band gap to be sensitive to a specific subtype or subband of ultraviolet radiation to be detected by selecting a specific composition of said Group-III Nitride layers.

3. The method for manufacturing an ultraviolet light sensor according to claim 2, wherein said step of selectively adjusting a band gap comprises selectively adjusting a band gap to be sensitive to UVA radiation.

4. The method for manufacturing an ultraviolet light sensor according to claim 2, wherein said step of selectively adjusting a band gap comprises selectively adjusting a band gap to be sensitive to UVB radiation.

5. The method for manufacturing an ultraviolet light sensor according to claim 2, wherein said step of selectively adjusting a band gap comprises selectively adjusting a band gap to be sensitive to UVC radiation.

6. The method for manufacturing an ultraviolet light sensor according to claim 1, wherein said step of forming first and second conductive contacts comprises forming such contacts on at least a portion of opposing outside surfaces.

7. The method for manufacturing an ultraviolet light sensor according to claim 1, wherein said step of forming Group-III Nitride layers comprises forming an n-type GaN layer on a buffer layer.

8. The method for manufacturing an ultraviolet light sensor according to claim 1, wherein said step of forming Group-III Nitride layers comprises growing a Group-III Nitride layer.

9. The method for manufacturing an ultraviolet light sensor according to claim 1, wherein said step of forming Group-III Nitride layers comprises depositing said Group-III Nitride layer by molecular beam epitaxy.

10. The method for manufacturing an ultraviolet light sensor according to claim 1, wherein said step of forming Group-III Nitride layers comprises depositing at least one Group-III Nitride layer by metal-organic chemical vapor deposition.

11. The method for manufacturing an ultraviolet light sensor according to claim 1, wherein said step of forming Group-III Nitride layers comprises depositing at least one Group-III Nitride layer by hydride vapor phase epitaxy.

12. The method for manufacturing an ultraviolet light sensor according to claim 1, wherein said step of forming Group-III Nitride layers comprises depositing at least one Group-III Nitride layer by remote plasma chemical vapor deposition.

13. The method for manufacturing an ultraviolet light sensor according to claim 1, wherein said step of forming first and second conductive contacts comprises forming at least one of said contacts as a grid so as to allow ultraviolet radiation to travel past said at least one contact to a top layer of said Group-III Nitride layers.

14. The method for manufacturing an ultraviolet light sensor according to claim 1, wherein said silicon wafer is of a material other than silicon carbide.

15. The method for manufacturing an ultraviolet light sensor according to claim 1, wherein said one of said Group-III Nitride layers is at least partially exposed such that the top surface thereof can receive ultraviolet light to be detected by the ultraviolet light sensor.

16. The method for manufacturing an ultraviolet light sensor according to claim 1, further comprising forming a buffer layer between one of said Group-III Nitride layers and said silicon wafer.

17. The method for manufacturing an ultraviolet light sensor according to claim 16, wherein said buffer layer comprises nitride.

* * * * *